United States Patent [19]

Machii et al.

[11] Patent Number: 5,295,434
[45] Date of Patent: Mar. 22, 1994

[54] PROCESS FOR MAKING PRELIMINARILY PRINTED FORMED BODY

[75] Inventors: Akihiko Machii; Atsuo Masaki; Yutaka Okunishi, all of Yokohama; Masao Ishinabe, Atsugi; Katsuhiro Imazu, Yokohama, all of Japan

[73] Assignee: Toyo Seikan Kaisha, Ltd., Tokyo, Japan

[21] Appl. No.: 987,541

[22] Filed: Dec. 7, 1992

Related U.S. Application Data

[63] Continuation of Ser. No. 580,981, Sep. 12, 1990, abandoned.

[30] Foreign Application Priority Data

Sep. 12, 1989 [JP]  Japan .................... 1-234695

[51] Int. Cl.⁵ .................... B41M 3/00; B41M 1/14
[52] U.S. Cl. .................... 101/211; 101/483
[58] Field of Search .................... 101/211, 483, 401.1, 101/363.1, 395, 485, 486, 481; 358/400, 140

[56] References Cited

U.S. PATENT DOCUMENTS 4,529,228  7/1985  Kramer .................... 101/399
4,692,810  9/1987  Machii et al. .................... 358/256

FOREIGN PATENT DOCUMENTS 0202928  11/1986  European Pat. Off. .
0371897   6/1990  European Pat. Off. .
2554610  10/1985  France .
61-267053 11/1986  Japan .
61-267763 11/1986  Japan .
62-93030   4/1987  Japan .

Primary Examiner—J. Reed Fisher
Attorney, Agent, or Firm—Sughrue, Mion, Zinn, Macpeak & Seas

[57] ABSTRACT

Disclosed is a process for making a preliminarily printed formed body, which is characterized in that a halftone separated rectangular printing plate is once made from a rectangular original, halftone dots of each halftone-separated image are developed on an annular plane by picture element units finer than the halftone dots to deform the shapes of the dots, an annular halftone dot image is formed based on the changes of the shapes of the halftone dots and a halftone printing plate for the annular halftone dot image is made, and this halftone printing plate is applied to a blank to be formed. According to this process undesirable formation of a striped pattern caused by the elongating flow of the blank in the height direction and the contracting flow of the blank in the circumferential direction is prevented and a strange feeling is not given to the printed image, and a faithful printed image can be reproduced.

7 Claims, 9 Drawing Sheets

FIG. I-A
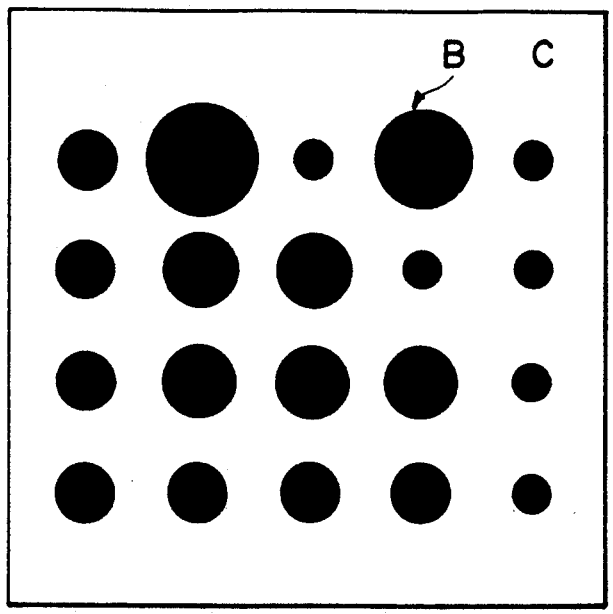
A
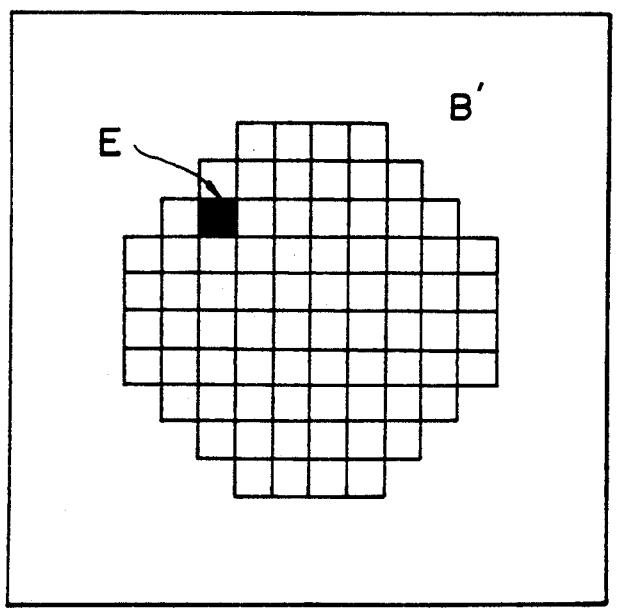
D

FIG. I-B
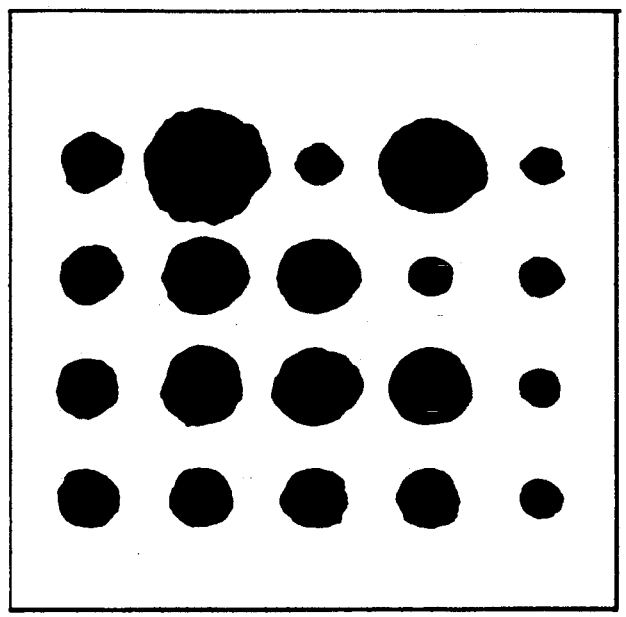
G
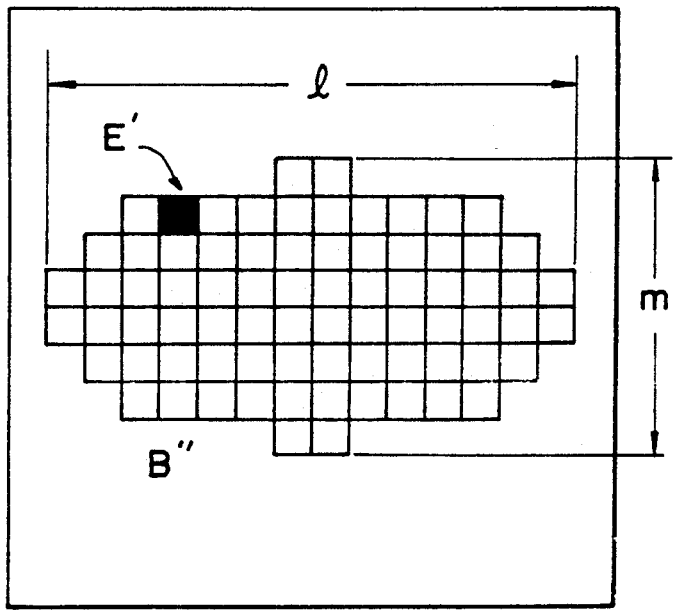
F

FIG. 2-A
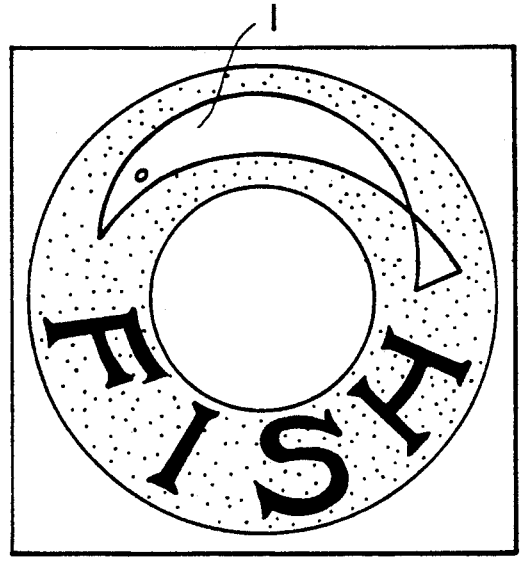
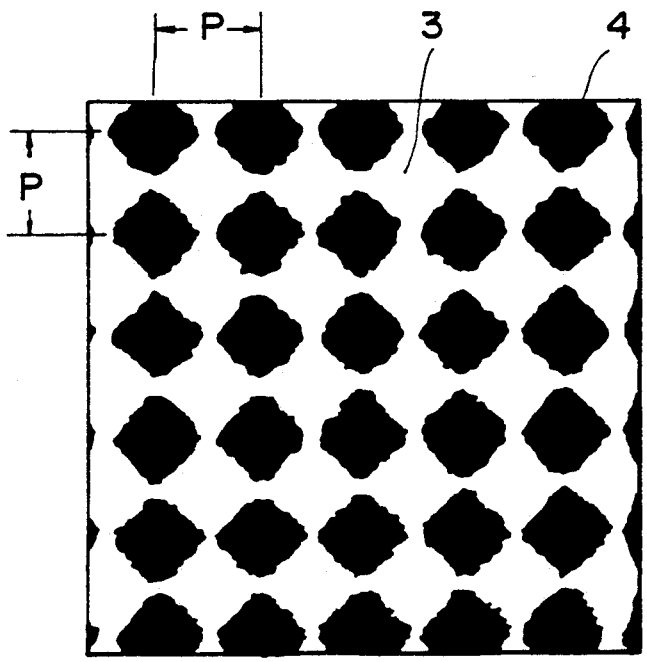

FIG. 2-B
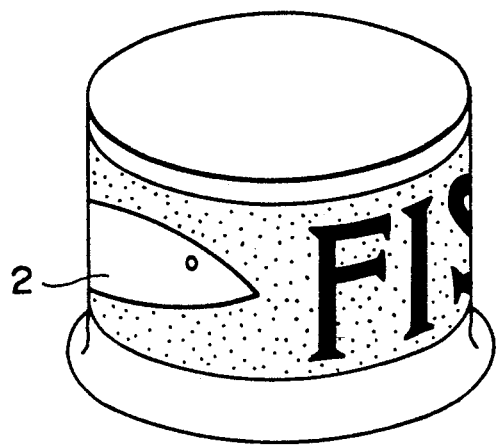
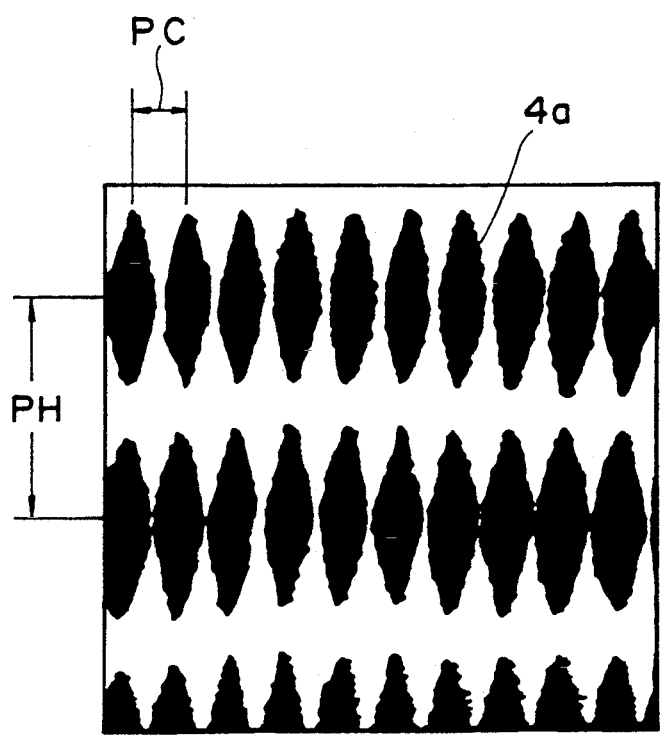

FIG. 6-A
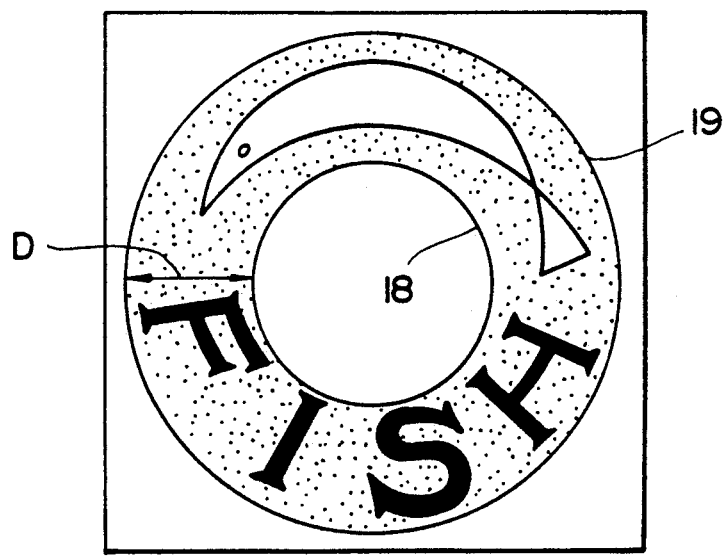

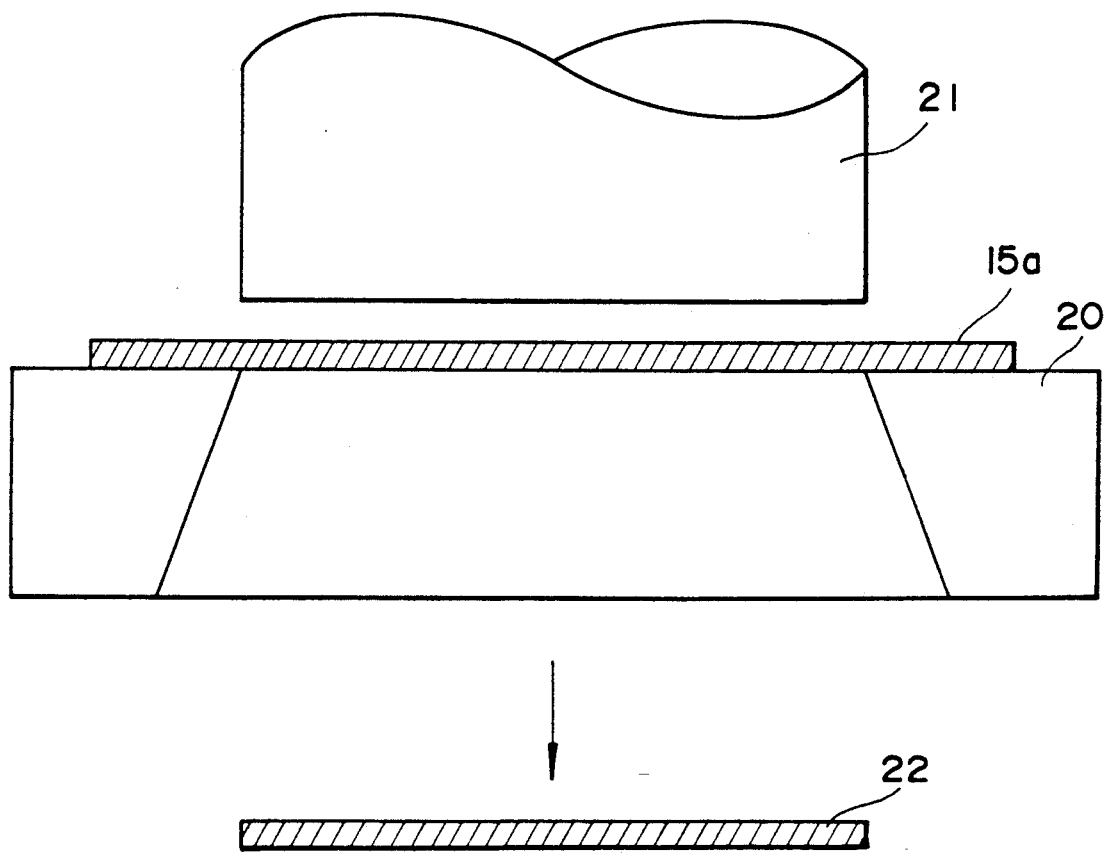

FIG. 6-C
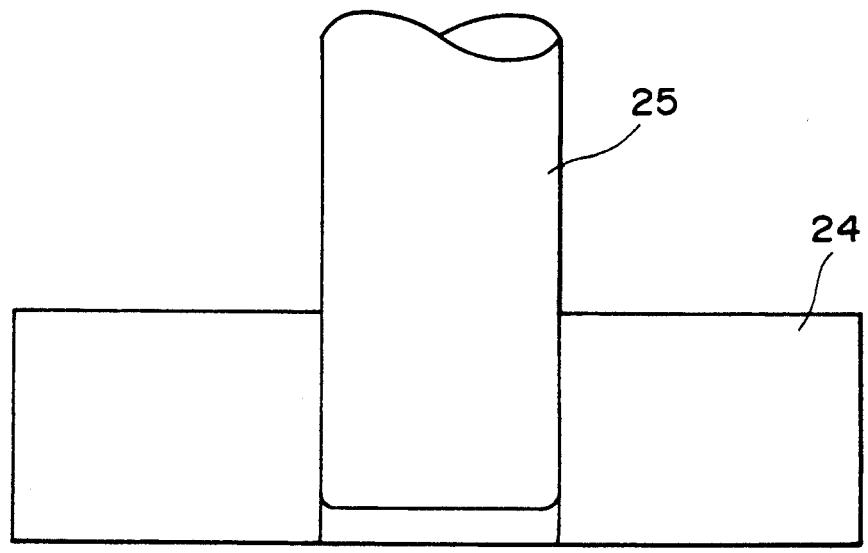
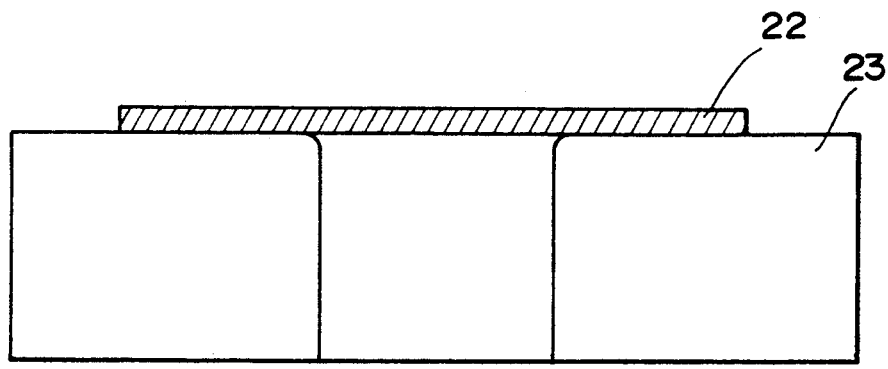

PROCESS FOR MAKING PRELIMINARILY PRINTED FORMED BODY

This is a continuation of application Ser. No. 07/580,981 filed Sep. 12, 1990 now abandoned.

BACKGROUND OF THE INVENTION

(1) Field of the Invention

The present invention relates to a process for making a preliminarily printed formed body. More particularly, the present invention relates to a process for making a draw-formed printed body by draw-forming a preliminarily printed metal blank, in which a printed image manifested on the side wall portion of a can is formed as a halftone printed image which is excellent in the dimension, size, distribution and arrangement of halftone dots and the reproducibility of this halftone printed image is improved.

(2) Description of the Related Art

Draw-forming of a surface-treated steel sheet such as a tinplate or tin-free steel sheet or a metal sheet such as an aluminum sheet is widely adopted for the manufacture of a so-called seamless can (two-piece can) and a metal cap. Coating or printing of individual formed bodies after the forming operation requires a complicated operation, and therefore, coating or printing of a flat blank before the draw-forming is desirable.

In the draw-forming, a flat metal blank undergoes the plastic flow and is formed into a cup-shaped body. When the plastic flow of the portion of the flat blank, that will constitute the circumferential side wall portion of the formed body, is taken into consideration, it is confirmed that in this portion, elongation is caused in the direction corresponding to the height direction of the formed body, while contraction is caused in the circumferential direction.

In the preliminary printing of a flat blank for draw-forming, in view of the above-mentioned plastic flow of the blank, it is necessary that an original which is rectangular in the developed state should be converted to an annular printing plate. As means for effecting this conversion, there are known a handwriting method, an optical conversion method and a digital conversion method proposed by us (Japanese Unexamined Patent Publication No. 61-267763 and Japanese Unexamined Patent Publication No. 61-267053).

According to the conventional halftone printing method for effecting this preliminary printing, an original image is inputted as a picture element signal into a plate-making computer, the inputted image is annularly developed by a deforming computer to form an annular image, the annular image is halftone-separated by an editing means to make a printing halftone plate, and a blank is printed by using this printing halftone plate.

However, in a formed body obtained by draw-forming a preliminarily printed metal blank, a striped pattern not found in the original print image is often formed at the upper part of the side wall portion, and even in the case where a simple original image is printed on the side wall portion of a can, the inherent impression of the halftone image is not found but a deformed image is observed, and a halftone printed picture having a good reproducibility cannot be obtained in the side wall portion of the can.

As the result of investigations made by us, it was found that in the draw forming of a preliminarily printed metal blank, at the upper part of the side wall portion, dots become continuous in the circumferential direction owing to the compression flow of the blank in the circumferential direction and spaces between dots in the height direction increase owing to the elongation flow of the blank in the height direction, and this deformation of the dots tends to result in formation of a striped pattern.

SUMMARY OF THE INVENTION

It is therefore a primary object of the present invention to provide a process for preparing a draw-formed printed can by draw-forming a preliminarily printed metal blank, in which undesirable formation of a striped pattern in the side wall portion can be prevented and the reproducibility of a faithful printed image can be improved.

Another object of the present invention is to provide a process for making a preliminarily prined formed body, in which a halftone printed image similar to an ordinary halftone printed image obtained on a non-deformed plane can be faithfully reproduced on the side wall portion of a formed body obtained by draw-forming.

In accordance with the present invention, there is provided a process for making a printed draw-formed body having a printed image on the side wall portion thereof by draw-forming a preliminarily printed blank, which comprises converting an image on an original to be printed to picture elements on rectangular coordinates, which are formed by halftone-separating the original image and are finer than halftone dots, developing the respective halftone dots by units of picture element signals on an annular plane corresponding to the rectangle to effect the coordinate transformation of the halftone dots to an aggregate of picture element signals on annular coordinates, making a printing halftone plate based on picture element signals on the transformed coordinates, and printing a blank by using the obtained printing plate.

BRIEF DESCRIPTION OF THE DRAWINGS

FIGS. 1-A and 1-B are diagram illustrating the principle of the invention of this application.

FIGS. 2-A and 2-B are diagrams illustrating undesirable formation of a striped pattern on the side wall portion of a draw-formed body.

FIGS. 6-A through 6-C are diagrams illustrating the steps of making the printed draw-formed body shown in FIG. 4.

DETAILED DESCRIPTION OF THE INVENTION

Figure 3:
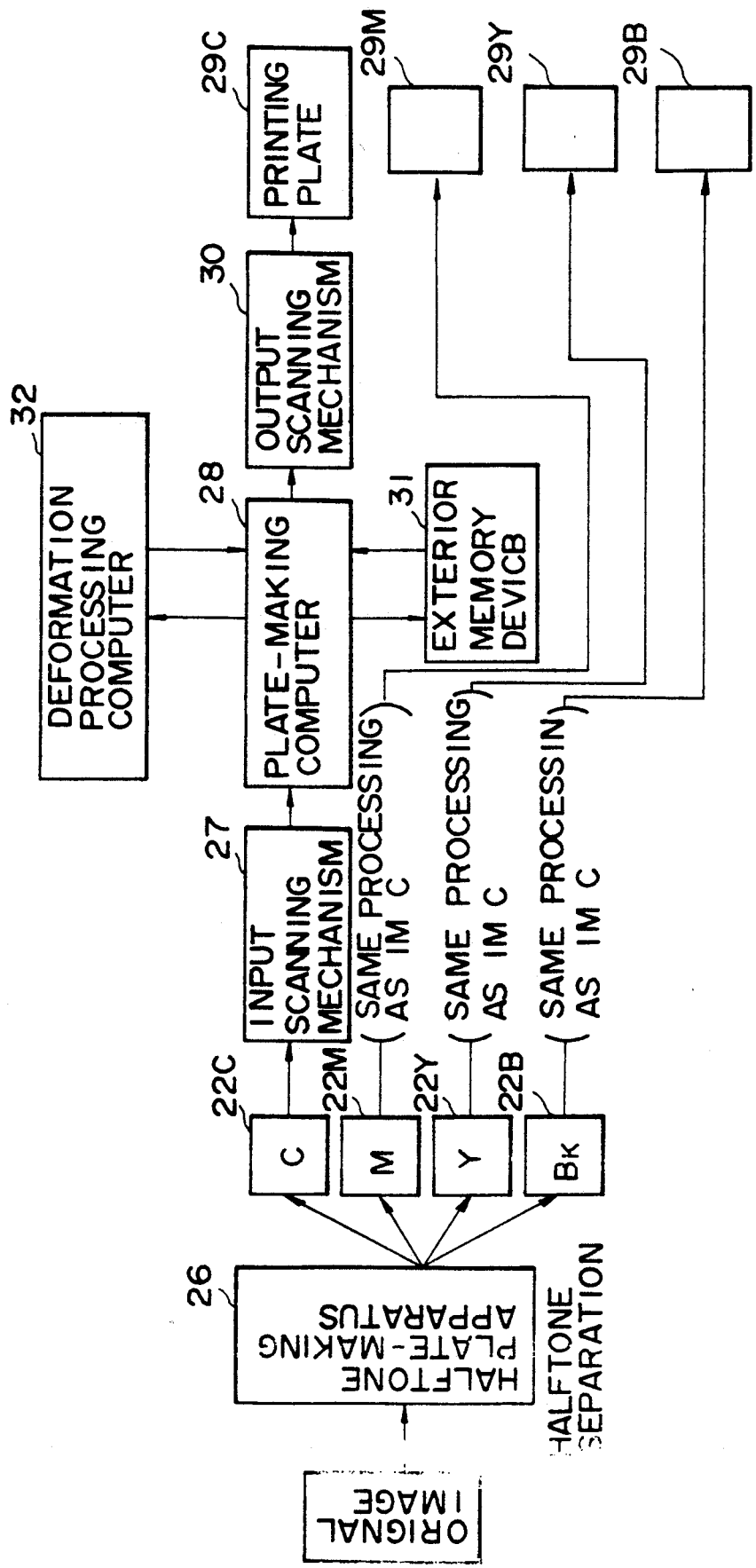
FIG. 3 is a block diagram illustrating the step of processing picture elements.

The present invention is characterized in that (1) an image on an original to be printed is converted to picture elements on rectangular coordinates, which are formed by halftone-separating the original image and are finer than halftone dots, and (2) the respective halftone dots are developed by units of picture element signals on an annular plane corresponding to the rectangle to effect the coordinate transformation of the halftone dots to an aggregate to picture element signals on annular coordinates. The present invention is based on the surprising finding that if a printing plate is made based on picture element signals on the transformed coordinates and a blank is printed by using the so-prepared printing plate, halftone dots which are substantially equal to the halftone dots on the rectangular coordinates in the size, shape, distribution and arrangement are faithfully reproduced.

Namely, according to the present invention, halftone dots are formed by the halftone separation in the state of rectangular coordinates and the image is separated into picture elements finer than the halftone dots within the range of the dots, and the rectangular coordinates are developed on an annular plane by units of the picture elements to transformed coordinates. In the transformed coordinates, the transformation is effected so that the plastic flow of the blank caused at the draw-forming step, that is, compression in the circumferential direction, and elongation in the radial direction (the height direction), can be compensated, and the halftone dots (halftone dots of the rectangular coordinates) are transformed to halftone dots in the form of an aggregate of picture elements. The plastic flow has already been taken into consideration in the transformed halftone dots. Namely, the halftone dots are elongated in the circumferential direction while taking the contraction into consideration, and the halftone dots are contracted in the radial direction while taking the elongation into consideration. If a metal blank is printed by using the so-obtained printing plate and the preliminarily printed metal is draw-formed, the above-mentioned predetermined plastic flow is caused and the transformed halftone dots are restored to the halftone dots before the transformation, with the result that the original halftone dots are faithfully reproduced on the side wall of the formed body.

Referring to FIGS. 2-A and 2-B illustrating undesirable formation of a striped pattern in the side wall portion, FIG. 2-A is an enlarged view (100 magnifications) of a print image of a blank 1 before the draw-forming processing, and FIG. 2-B is an enlarged view (100 magnifications) of a print image at the upper part 2 of the side wall portion after the draw-forming processing. In the blank 1 before the draw-forming processing, dots 4 are regularly arranged at certain pitches P in a white background 3 in either the longitudinal direction (height direction) or the lateral direction (radial direction). The pitch P is smaller than the space that can be distinguished by the naked eye. In contrast, at the upper part 2 of the side wall portion after the processing, the substantially square dots 4 are deformed to long rhombic dots 4a according to the elongation flow in the height direction and the contraction flow in the circumferential direction at the draw-forming processing or the thickness-reducing draw-forming processing, and the pitch in the height direction is increased to PH and the pitch in the circumferential direction is contracted to PC. Since the pitch of the dots in the circumferential direction is contracted to PC and the dots are substantially contiguous to one another and also since the pitch of dots in the height direction is expanded to PH that can be distinguished by the naked eye, the arrangement of the dots in FIG. 2-B is discriminated as a striped pattern.

Namely, even if a printing plate is made by developing an original image to an annular plane and halftone-separating the annular image, since the halftone dots per se are deformed at the draw-forming step, and a striped pattern is undesirably formed, and a strange feeling of the image is given.

In contrast, according to the present invention, this defect can be effectively overcome by the above-mentioned mechanism, and halftone dots can be faithfully reproduced on the surface of the draw-formed printed body. Referring to FIGS. 1-A and 1-B illustrating the principle of the present invention, A is an enlarged view of a halftone-separated original image, in which B represents a halftone dot and C represents a background (white background portion). D represents rectangular coordinates separated into picture elements finer than the halftone dots, and an aggregate of picture elements E forms a dot B. The size and shape of the dot B' are macroscopically the same as those of the dots B. F shows transformed coordinates formed by developing the rectangular coordinates on an annular plane, and the picture elements E on the rectangular coordinates are transformed to picture elements E'. In the dot B" consisting of an aggregate of these picture elements E', in view of the deformation owing to the plastic flow. the size l in the circumferential direction is expanded while the size m in the radial direction is contracted. G shows, in the developed and enlarged state, the side face of the printed formed body obtained by using the printing plate made based on the transformed coordinates F and carrying out the draw forming. It is seen that the halftone dots are substantially equal to the halftone dots B of the original in the size and shape, and they are formed on the side face at substantially equal pitches to those in the original.

One preferred embodiment of the present invention will now be described with reference to the accompanying drawings.

Figure 4:
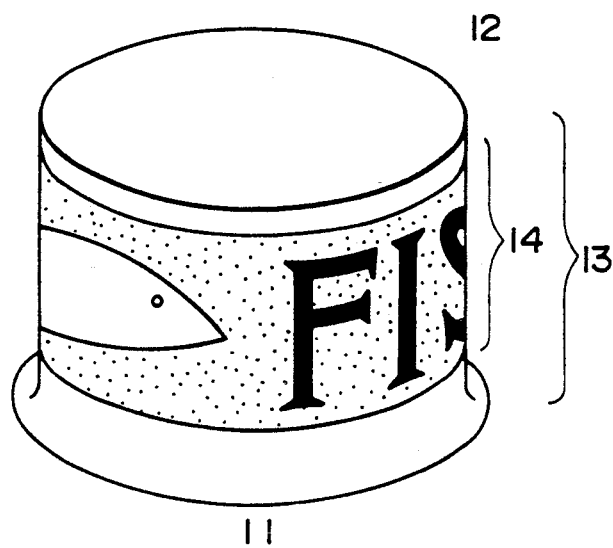
FIG. 4 is a perspective view illustrating a printed draw-formed body.
Figure 5:
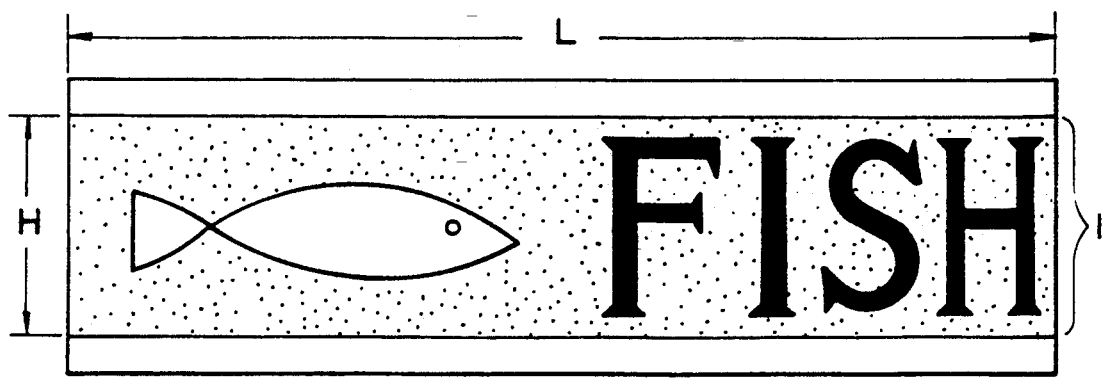
FIG. 5 is a diagram illustrating the circumferential side wall portion of the printed draw-formed body of FIG. 4 in the developed state.

Referring to FIG. 4 illustrating a printed draw-formed body, this printed draw-formed body 11 comprises a bottom 12 and a circumferential side wall 13 seamlessly integrated with the bottom 12, and a print layer 14 is formed on this side wall 13. Referring to FIG. 5 showing the peripheral side wall 13 in the developed state, the print layer has a rectangular shape having a length L and a height H.

Referring to FIGS. 6-A through 6-C illustrating the steps of preparing a draw-formed printed formed body 11, at first, an annularly developed print layer 17 is applied to a flat, metal blank by using a halftone-separating printing plate (FIG. 6-A). This annular print layer 17 has an inner circumferential portion 18 almost equal to the length L of the rectangular print layer 14 and an outer circumferential portion 19 larger than the length L, and the difference D between the radius of the circumferential portion and the radius of the inner circumferential portion is smaller than the height H of the rectangular print layer 14 and the area of the annular print layer 17 is substantially equal to or smaller than the area of the rectangular print layer 14. The degree of this contraction of the area corresponds to the degree of the thickness reduction of the side wall portion.

The printed metal blank 15a is punched into a circular blank 22 by using a shearing die 30 and a shearing punch 31 at the shearing step shown in FIG. 6-B. Then, at the draw-forming step shown in FIG. 6-C, the circular blank or pre-drawn cup 22 is gripped between a drawing die 33 having a diameter corresponding to the outer diameter of the formed body and a blank holder 34, and a drawing punch 25 having an outer diameter corresponding to the inner diameter of the formed body is pressed into the circular blank 22 to form a draw-formed body 11 shown in FIG. 4.

The preparation of the halftone-separated printing plate to be applied to the blank of the formed body will now be described.

The halftone-separating printing plate is made according to the flow chart of FIG. 3. At first, a rectangular original image as shown in FIG. 5 is set at a halftone plate-making apparatus 26, in which color resolution of the original image is carried out, and a rectangular C halftone-separating plate 22C (cyan halftone-separating plate), a rectangular M halftone-separating plate 22M (magneta halftone-separating plate), a rectangular Y halftone-separating plate 22Y (yellow halftone-separating plate) and a rectangular BK halftone-separating plate 22B (black halftone-separating plate) are made. Then, rectangular halftone-separated images based on these halftone-separating plates are prepared and they are read in an input scanning mechanism 27. In this case, the halftone plate-making apparatus 20 can be integrated with the input scanning mechanism 20 so that the input scanning can be directly performed without forming a rectangular halftone-separated image.

Referring to the block diagram of FIG. 3 illustrating the halftone-scattered image processing treatment, the apparatus to be used for this process comprises, in general, an input scanning mechanism 27 for converting each of halftone-separated images to an electric signal, a known plate-making computer 28 for performing analog/digital conversion of a picture element signal finer than the dot from the input scanning mechanism 27, inputting it as a digital picture element signal, performing, if necessary, aditining operations such as correction, cutting, designation of the position, trimming and character composition, performing digital/analog conversion of the digital picture element signal and inputting the converted signal, an output scanning mechanism 30 for making a printing plate or block copy based on an electric signal from the computer 28, a recording material 31 for storing data of the plate-making computer 28, and a deformation processing computer 32 for transforming the rectangular coordinates of the digital picture element signal from the plate-making computer 28, to annular coordinates having the same area as that of the rectangular coordinates and inputting the picture element signal on the transformed coordinates into the plate-making computer 32 again.

A known input plane scanning system where an original is read line by line in the direction of the axis X (main scanning) and then, the original is read line by line in the direction of the axis Y (subsidiary scanning) can be used as the input scanning mechanism 27, and the reading scanning is carried out by detecting reflected light or transmited light by a photomultiplier tube, a phototransistor or a charge coupling device.

The plate-making computer 28 comprises a central processing unit (CPU) for receiving and analyzing input and output commands, working various programs and controlling input and output devices, a terminal equipment for issuing instructions to central processing unit (CPU), and a station for carrying out the image processing and editing, and the computer 28 further comprises a disk drive for use in storing systems and various files, and a magnetic tape device for reading the systems and saving and restoring the files. As a typical instance of the plate-making computer, there can be mentioned Response 300 Series marketed by Scilex, Israel. Furthermore, there can be used plate-making computers such as Studio 800 Series (Crossfield, Great Britain), Chromacom System (Rudolf Hell, West Germany), Pagematic System (Dai-Nippon Ink Kagaku Kogyo) and Sigmagraph System 2000 (Dai-Nippon Screen Seizo).

According to the present invention, by the deformation processing computer 32, the rectangular coordinates are transformed to digital coordinates of an annular plane having the same area as that of this rectangle, an annular plane having a diminished area corresponding to the reduction of the thickness in the case where the thickness of the side wall is reduced, or an annular plane having a slightly enlarged area in the case where the side wall becomes a tapered surface, and data of each halftone dot are transformed by picture element units finer than the halftone dot and picture elements on the transformed coordinates are read out and outputted in order of the coordinates.

This transformation of the coordinates can be performed according to the method and flow chart disclosed in Japanese Unexamined Patent Publication No. 61-267763 and Japanese Unexamined Patent Publication No. 61-267053, and furthermore, the transformation of the coordinates can be performed while making a correction based on the anisotropy of elongation of a metal blank. The latter method is disclosed in detail in Japanese Unexamined Patent Publication No. 62-93030.

In the case where bending deformation and rebending deformation are caused by using a redrawing die having a small radius of curvature at the deep-drawing (re-drawing) step and the thickness of the side wall portion is thus reduced, while taking it into consideration that the side wall portion is elongated in the height direction at the draw forming and re-draw forming, the rectangular printed original is subjected to a digital image processing of diminishing the original image in the height direction, and simultaneously with or subsequently to this processing, the above-mentioned transformation processing of developing the diminished original image to an annular plane is carried out.

The coordinate-transformed data are inputted into the plate-making computer 28 in order of recording.

The picture element signals on the transformed coordinates are supplied to the output scanning mechanism 30 in order of the coordinates and a printing plate or block copy is made.

A known scanning recording system can be adopted as the output scanning mechanism 30. For example, there can be adopted various systems utilizing a silver salt photographing method, a dry silver recording method, an electrophotographic method, an electrostatic recording method, a negative or positive photoresist recording method, a photopolymer recording method, a diazo photographing method, a gelatin dichromate plate-making method, an electrolytic recording method, a discharge breakdown recording method, an electric thermal recording method, a thermal recording method, a pressure recording method, an ink jet recording method or the like. As the scanning system, there can be adopted mechanical scanning systems such as a cylinder scanning system, a rotary disk scanning system, a helix cylinder scanning system, a belt type plane scanning system and a multi-needle plane scanning system, electron tube scanning systems such as a flying spot tube system, an optical fiber system and a multi-needle electrode tube system, and solid scanning systems such as a multi-needle electrode head system.

In the present invention, among these various recording systems, a laser recording system is preferably used for reading an original and forming a printing plate, because this recording system is advantageous in that light energy can be concentrated on a micro-fine region of the wavelength order, light beams can be scanned over a broad region and on-off scanning can be performed at a high speed. He-Ne laser, Ar laser, He-Cd laser and the like can be used as the laser beam source.

In the present invention, the picture element density in the rectangular coordinates and final transformed coordinates can be changed over a broad region according to need, but it is general preferred that the picture element density be 12 to 100 dots/mm. In case of a pattern original, it is especially preferred that the picture element density be 12 to 14 dots/mm, and in case of a letter original, it is preferred that the picture element density be 36 to 100 dots/mm.

A halftone screen for the halftone separation, which has a pitch of 50 to 300 lines/inch, especially 100 to 200 lines/inch, is advantageously used.

For making a monochromatic image printing plate, of the halftone-separating printing plates 29C, 29M, 29Y and 29B shown in FIG. 3, the plates 29B, 29M and 29Y need not be used.

As is apparent from the foregoing description, according to the present invention, a halftone-separated rectangular printing plate is once made from a rectangular original, halftone dots of each halftone-separated image are developed on an annular plane by picture element units finer than the halftone dots to deform the shapes of the dots, an annular halftone dot image is formed based on the changes of the shapes of the halftone dots and a halftone printing plate for the annular halftone dot image is made, and this halftone printing plate is applied to a blank to be formed, whereby undesirable formation of a striped pattern caused by the elongating flow of the blank in the height direction and the contracting flow of the blank in the circumferential direction is prevented and a strange feeling is not given to the printed image, and a faithful printed image can be reproduced.

We claim:

1. A process for making a printed draw-formed body having a printed image on the side wall portion thereof by draw-forming a preliminarily printed blank, which comprises:
    separating an image on an original to be printed into halftone dots;
    converting each of the halftone dots into an aggregate of picture element signals with rectangular coordinates, said elements being finer than the halftone dots;
    developing the respective halftone dots by units of picture element signals onto an annular plane corresponding to the rectangular coordinates and transforming the halftone dots of the rectangular coordinates into deformed halftone dots on the annular plane comprising an aggregate of the picture element signals and having an expanded size in the circumferential direction and a contracted size in the radial direction so that a compression in the circumferential direction and an elongation in the radial direction due to the plastic flow of the blank caused at the draw-forming step are compensated;
    making a printing halftone plate based on picture element signals with the transformed coordinates; and
    printing a blank using the obtained printing plate.

2. A process according to claim 1, wherein the process includes reading the original and forming the printing plate using a laser recording method.

3. A process according to claim 1, wherein a picture element density in the rectangular coordinates and final transformed coordinates is in the range of from 12 to 100 dots/mm.

4. A process according to claim 3, wherein the original is a pattern original and the picture element density is 12 to 14 dots/mm.

5. A process according to claim 3, wherein the original is a letter original and the picture element density is 36 to 100 dots/mm.

6. A process according to claim 1, wherein a halftone dot screen having a pitch of 50 to 300 lines/inch is used for separating the original into halftone dots.

7. A process according to claim 1, wherein the halftone dots of the rectangular coordinates are transformed into the deformed halftone dots on the annular plane, so that the halftone dots of the rectangular coordinates and the deformed halftone dots on the annular plane consist of the aggregate of substantially the same number of the picture element signals.

* * * * *